United States Patent [19]
Saeki et al.

[11] Patent Number: 5,460,684
[45] Date of Patent: Oct. 24, 1995

[54] STAGE HAVING ELECTROSTATIC CHUCK AND PLASMA PROCESSING APPARATUS USING SAME

[75] Inventors: Hiroaki Saeki; Teruo Asakawa; Noboru Masuoka; Masaki Kondo, all of Yamanashi, Japan

[73] Assignee: Tokyo Electron Limited, Tokyo, Japan

[21] Appl. No.: 160,842

[22] Filed: Dec. 3, 1993

[30] Foreign Application Priority Data

Dec. 4, 1992 [JP] Japan .................................. 4-350844
Dec. 8, 1992 [JP] Japan .................................. 4-351967

[51] Int. Cl.⁶ .............................. C23F 1/02; C23C 16/52; C23C 14/50
[52] U.S. Cl. .............. 156/345; 204/298.15; 204/298.31; 204/298.34; 118/723 E; 118/725; 118/728; 216/67
[58] Field of Search ................... 156/345, 643; 118/724, 725, 728, 723 MW, 723 ME, 723 MR, 723 MA, 723 E, 723 ER, 723 I, 723 IR, 723 R; 204/298.15, 298.31, 298.34

[56] References Cited

U.S. PATENT DOCUMENTS

| | | | |
|---|---|---|---|
| 4,771,730 | 9/1988 | Tezuka | 118/728 |
| 4,798,650 | 1/1989 | Nakamura et al. | 156/345 |
| 5,203,945 | 4/1993 | Hasegawa et al. | 156/345 |
| 5,221,450 | 6/1993 | Hattori et al. | 204/298.15 |
| 5,234,527 | 8/1993 | Nozawa et al. | 156/345 |
| 5,250,137 | 10/1993 | Arami et al. | 118/728 |
| 5,275,683 | 1/1994 | Arami et al. | 156/345 |
| 5,280,156 | 1/1994 | Niori et al. | 118/725 |
| 5,290,381 | 3/1994 | Nozawa et al. | 118/725 |

*Primary Examiner*—Robert Kunemund
*Assistant Examiner*—Rodney G. McDonald
*Attorney, Agent, or Firm*—Oblon, Spivak, McClelland, Maier & Neustadt

[57] ABSTRACT

The plasma etching apparatus for a semiconductor wafer includes a susceptor provided in the vacuum process chamber. An electrostatic chuck for attracting and holding the wafer is provided on the susceptor. The electrostatic chuck comprises a chuck electrode provided on the susceptor via an insulative layer. The chuck electrode is connected to the positive terminal of the DC power supply via a switch. The chuck electrode is coated with a resistive layer, and the wafer is placed directly on the resistive layer. The resistive layer exhibits an electric resistivity of $1 \times 10^{10}$ $\Omega \cdot$cm to $1 \times 10^{12}$ $\Omega \cdot$cm in a temperature range for etching. The resistive layer is formed to have such a surface roughness that a center line average hight falls within a range of 0.1 to 1.5 μm. When the potential of the positive terminal of the DC power supply is applied to the chuck electrode, and the wafer is grounded via plasma, a contact potential difference is created between the surface of the resistive layer and the rear surface of the wafer, generating an electrostatic attractive force, so that the wafer is attracted and held by the resistive layer.

13 Claims, 5 Drawing Sheets

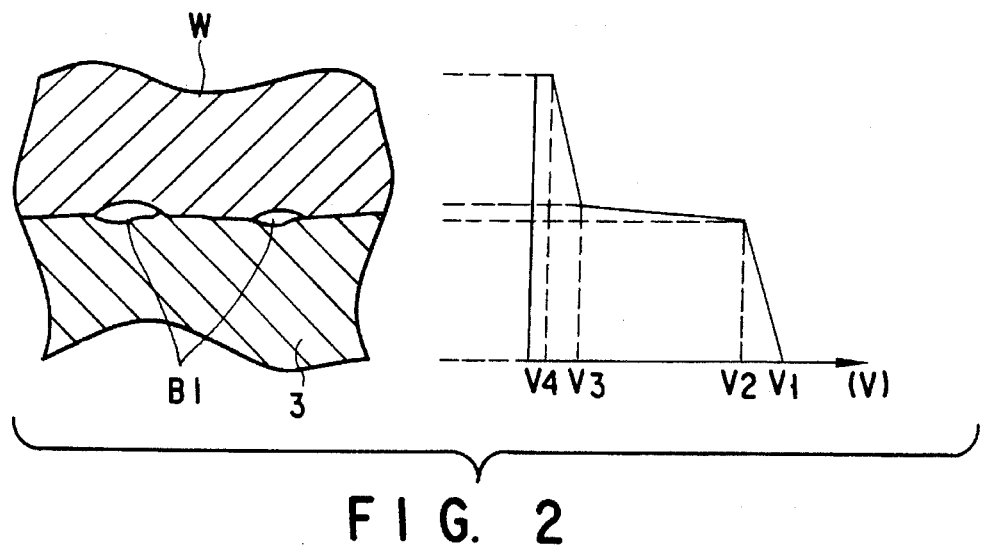
F I G. 2
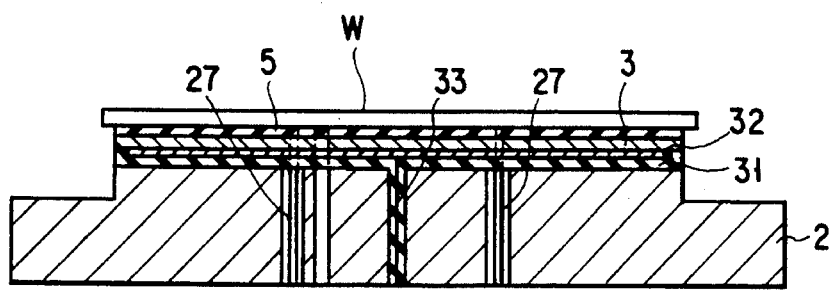
F I G. 4

STAGE HAVING ELECTROSTATIC CHUCK AND PLASMA PROCESSING APPARATUS USING SAME

BACKGROUND OF THE INVENTION

1. Field of the Invention

The present invention relates to a stage having an electrostatic chuck, used for attracting and holding a to-be-processed substrate such as a semiconductor wafer during a process such as etching or film formation for the substrate, and the plasma processing apparatus employing such a stage.

2. Description of the Related Art

In a processing apparatus such as a plasma etching apparatus for processing semiconductor wafer one by one, a susceptor which serves as a lower electrode is provided in its process chamber which can be set to a vacuum state. A wafer, to-be-processed substrate, is placed on and fixed to the susceptor, and then subjected to the process. There are mainly two commonly-used ways of fixing a wafer to a susceptor, i.e. the mechanical supporting means such as clamp, and the electrostatic chuck for attracting a wafer by means of an electrostatic attractive force.

U.S. Pat. No. 4,771,730, issued on Sep. 20, 1988, discloses an electrostatic chuck provided on a susceptor or a table for holding a to-be-processed substrate. The electrostatic chuck includes two dielectric layers, and an electrode interposed therebetween. The electrode is connected to the positive terminal of an external direct current (DC) power supply, and the negative terminal of the direct current power supply is grounded. A heat conductive gas is supplied between the wafer and the upper dielectric layer. The US Patent discloses a structure in which an $Al_2O_3$ layer is used as a dielectric layer, in FIG. 2, and a structure in which a polyimide sheet is used as a dielectric layer, in FIG. 3.

When plasma is generated in the process chamber, the semiconductor wafer placed on the electrostatic chuck is grounded via the plasma and the upper electrode. With this structure, if a positive potential is applied to the electrode of the electrostatic chuck from the DC power supply, the wafer will have a negative potential, and the upper dielectric layer is polarized, with its upper surface having a positive potential. Therefore, an electrostatic attractive force is generated between the wafer and the dielectric layer, and due to the attractive force, the wafer is attracted and held on the susceptor.

However, with such an electrostatic chuck, attractive force remains (to be called as "residual attractive force" hereinafter) between the wafer and the chuck even if the electrode of the electrostatic chuck and the power supply are disconnected after the process. In this state, when the wafer is lifted with pusher pins built in the susceptor, a large force is applied to the wafer locally, thereby damaging or displacing the wafer. To solve this problem, there have been proposed several methods of removing residual electric charge on the rear surface of the wafer or the surface of the chuck, as shown in application Ser. No. 08/017,379 now abandoned, filed on Feb. 12, 1993.

In addition, since a dielectric sheet of polyimide is likely to have a dielectric breakdown when it is too thin, the sheet is generally formed to have a thickness of about 50 µm. In accordance with such a thickness, the voltage of the DC power supply should be set high in order to obtain a strong attractive force. However, if a high voltage is involved, an unnecessary discharge is likely to occur, or the cost of the power supply is raised.

SUMMARY OF THE INVENTION

The object of the present invention is to provide a stage having an electrostatic chuck which does not generate residual remaining attractive force.

According to an aspect of the present invention, there is provided a stage having an electrostatic chuck for attracting and holding a substrate having a main surface to be processed, and a rear surface opposite to the main surface, by an electrostatic attractive force, comprising:

a main body having a supporting surface for supporting the substrate via the rear surface thereof;

a chuck electrode provided on the holding surface;

power supply means for selectively applying a first potential to the chuck electrode; and a resistive layer for covering the chuck electrode, the resistive layer having a surface facing the rear surface of the surface when the substrate is supported by the supporting surface, and the resistive layer exhibiting an electric resistivity of $1\times10^{10}$ $\Omega\cdot$cm to $1\times10^{12}$ $\Omega\cdot$cm in a temperature range when attracting the substrate, wherein while the first potential is applied to the chuck electrode and a second potential different from the first potential is applied to the substrate, a contact potential difference is created between the surface of the resistive layer and the rear surface of the substrate, and the substrate is attracted and held by the resistive layer.

According to another aspect of the present invention, there is provided a stage having an electrostatic chuck for attracting and holding a substrate having a main surface to be processed, and a rear surface opposite to the main surface, by an electrostatic attractive force, comprising:

a main body having a supporting surface for supporting the substrate via the rear surface thereof;

first and second electrode arranged on the holding surface, the first and second electrodes being insulated from each other;

first power supply means for selectively applying a first potential to the first electrode;

second power supply means for selectively applying a second potential different from the first potential to the second electrode;

switch means, located closer to the first and second electrodes than to the first and second power supply means, for selectively connecting and separating the first and second electrodes; and first and second resistive layers for covering the first and second electrodes, respectively, the first and second resistive layers being insulated from each other, each having a surface brought into contact with the rear surface of the substrate when the substrate is supported by the supporting surface, and each exhibiting an electric resistivity of $1\times10^{10}$ $\Omega\cdot$cm to $1\times10^{12}$ $\Omega\cdot$cm in a temperature range when attracting the substrate, wherein while the first and second potentials are applied to the first and second electrodes, respectively, a closed loop from the first power supply means via the substrate to the second power supply means is formed, a contact potential difference is created between the surface of each of the first and second resistive layers and the rear surface of the substrate, and the substrate is attracted and held by the first and second resistive layers, and while the first potential is applied to the first and second electrodes, and a third potential different from the first potential is applied to the substrate, a contact potential difference is created between the surface of each of the first and second resistive layers and the rear surface of the substrate, and the substrate is attracted and held by the first and second resistive layers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is an enlarged cross sectional view showing an interface between the resistive layer of an electrostatic chuck of the present invention, and a wafer;

FIG. 4 is a cross sectional view showing a plasma etching apparatus according to a second embodiment of the present invention;

DETAILED DESCRIPTION OF THE PREFERRED EMBODIMENTS

Figure 1:
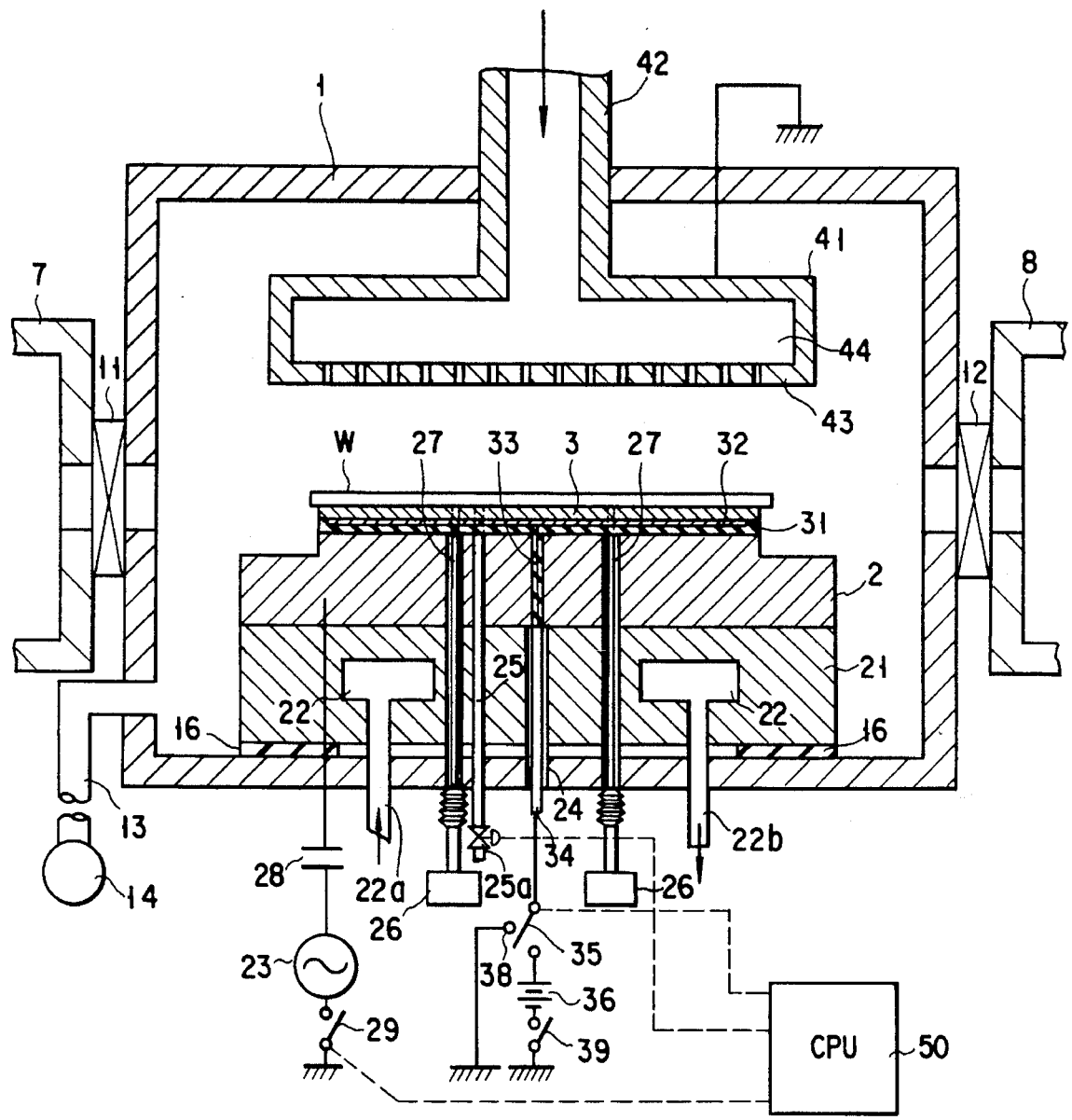
FIG. 1 is a cross sectional view showing a plasma etching apparatus according to a first embodiment of the present invention.

The plasma etching apparatus according to the first embodiment of the present invention, which is shown in FIG. 1, includes a process chamber 1 made of a conductive metal such as aluminum having an anodic oxide surface. On a side wall of the process chamber 1, gate 11 and 12 are provided for closing passage ways to the first and second load lock chambers 7 and 8, respectively. A vacuum pump 14 is connected to the lower portion of the process chamber 1 via an exhaustion pipe 13. By means of an exhaustion pump 14, the pressure in the process chamber 1 can be reduced to a desired vacuum level.

A cooling block 21 is provided at the center of the bottom portion of the process chamber 1 via an insulator 16. The cooling block 21 is formed of a conductive metal such as aluminum having an anodic oxide surface, into, for example, a column shape. In the cooling block 21, a bore 22 is formed for the purpose of circulating a coolant such as liquid nitrogen. An introduction tube 22a and an exhaustion tube 22b are connected to the bore 22, and the cooling liquid is supplied into the bore 22 via the introduction tube 22a, and is exhausted to the outside of the process chamber 1 via the exhaustion tube 22b.

On the cooling block 21, the susceptor 2 made of a conductive material such as aluminum having an anodic oxide surface is detachably fixed by means of, for example, bolts (not shown). The susceptor 2 serves as a lower electrode, and is connected to a high-frequency power supply 23 provided outside the process chamber 1 via a capacitor 28. The power supply 23 is grounded via a switch 29.

The upper surface of the susceptor 2 serves as a wafer-holding surface, and an insulative layer 31 made of, e.g., polyimide is adhered to the upper surface. On the insulative layer 31, a conductive chuck electrode 32 and a resistive layer 3 made of a material having a high value of resistance are arranged in this order. A semiconductor wafer W is placed on the resistive layer 3. In this embodiment, the chuck electrode 32 is made of silver paste, and applied on the lower surface of the resistive layer 3. The chuck electrode 32 may be prepared by forming a silver or palladium film on the lower surface of the resistive layer 3 by screen printing in place of the application of the silver paste.

A conductive line 33 covered by an insulation cable is provided in the suceptor 2, one end of the line 33 being connected to the chuck electrode 32. A through-hole 24 is formed in the cooling block 21 at a position corresponding to the conductive line 33. In the through-hole 24, an electric supplying rod 34 is provided such that the rod is connected to the other end of the conductive line 33. The electric supplying rod 34 is connected to the DC power supply 36 provided outside the apparatus via a switch 35. With the mentioned structure, the chuck electrode 32 is connected to the DC power supply 36 via the conductive line 33, the electric supplying rod 34, and the switch 35. The switch 35 is a relay switch, and can be switched to a terminal 38 of the grounding line. The power supply 36 is grounded via the switch 39.

From the resistive layer 3 to the cooling block 21, there is formed a gas supplying passage 25 for supplying a heat conductive gas to the rear surface of the wafer W placed on the resistive layer 3. The supplying passage 25 is connected to a heat conductive gas source (not shown) such as of He via a valve 25a. Further, from the resistive layer 3 to the cooling block 21, there are a plurality of, for example, three pusher pins 27 for moving the wafer up and down with respect to the upper surface of the resistive layer 3. The pusher pins 27 are actuated by driving means 26.

Above the susceptor 2, there is provided an upper electrode 41 made of a conductive material such as aluminum having an anodic oxide surface. The upper electrode 41 is arranged so as to face the susceptor 2 serving as a lower electrode. The upper electrode 41 is grounded, and constitutes a pair of counter electrodes of the parallel-plate type, together with the susceptor 2, which is the lower electrode, connected to the high-frequency power supply 23.

The upper electrode 41 includes a bore 44 inside, and serves as a header for supplying a process gas. To the bore 44, there is connected a gas introduction tube 42, through which the process gas, for example, a mixture of a reactive gas, CF$_4$ and a carrier gas, At, is supplied. At the lower portion of the upper electrode 41, there is provided a gas diffusion plate 43 for supplying the process gas into the process chamber 1, for example, in a shower-like manner.

The operation of each of the switch 35 of the DC power supply 36, the switch 29 of the high-frequency power supply 23, and the valve 25a for switching the heat conductive gas, is controlled by a control unit 50. A predetermined program is stored in the control unit 50 in advance, and each of these members is switched in accordance with an instruction output on the basis of the program.

The susceptor 2 and the cooling block 21 are electrically insulated from the members outside the process chamber 1 (except for the high-frequency power supply 23). Such a version is disclosed in application Ser. No. 08/104,475, filed on Jul. 18, 1993 now abandoned, the teachings of which are hereby incorporated by reference.

The process of a semiconductor wafer W is carried out in the following steps. First, the wafer W is loaded from the load lock chamber 7 through the gate 11 into the process chamber by means of a transfer arm (not shown) provided in the first load lock chamber 7. The wafer W is then placed on the susceptor 2 by the transfer arm and the pusher pins 27, which move in cooperation with each other.

Next, the process gas is supplied into the process chamber 1 from the gas introduction tube 42 via the bore 44 of the upper electrode 41, and the gas diffusion plate 42. At the same time, the process chamber 1 is exhausted by the pump 14 via the exhaustion tube 13 so as to maintain the pressure of the inside of the process chamber at a certain vacuum level. Further, a high-frequency voltage, for example, of 380 kHz and 1.5 kW is applied from the high frequency power supply 23 between the susceptor 2 and the upper electrode 41, and thus, the process gas is made into plasma on the wafer W.

Further, the positive terminal of the DC power supply 36 having a voltage of 300 V is connected to the chuck electrode 32. Thus, there is generated an electrostatic attractive force, by which the wafer W is held on the susceptor 2 via the resistive layer 3 of the electrostatic chuck. The heat conductive gas is supplied between the wafer and the resistive layer 3, and cold is transferred from the cooling block 21 to the wafer W so as to set a temperature of the wafer W.

Ions contained in the plasma are irradiated vertically onto the surface of the wafer W so as to physically etch the target substance located on the surface. Active species contained in the plasma react with the substance, and thus the surface of the wafer is chemically etched.

After the completion of etching of the wafer W, the supply of the process gas and the heat conductive gas is stopped, and the high-frequency power supply 23 is turned off. Consequently, the inside of the process chamber 1 is replaced by an inert gas to a certain degree. Also, the switch 35 is operated to switch from the power supply 36 to the ground terminal 38. Then, the pusher pins 27 project from the resistive layer 3 so as to push up the wafer from the susceptor 2. After that, the wafer w is unloaded from the process chamber 1 to the load lock chamber 8 via the gate 12 by means of a transfer arm (not shown) provided in the second load lock chamber 8.

The thickness of the resistive layer 3 of the electrostatic chuck is set at 5 mm or less. The resistive layer 3 is made of a material having an electric resistivity Re of $1\times10^{10}$ $\Omega\cdot$cm to $1\times10^{12}$ $\Omega\cdot$cm. An example of the material is commercially available SiC. Another example is commercially available Al$_2$O$_3$, which is prepared to have an electric resistivity falling in the above range by adjusting the contents of the conductive impurities.

The electric resistivity of the material decreases usually as the temperature of use increases. Therefore, it is necessary to select such a material for the resistive layer 3 as to exhibit an electric resistivity within the above range at a temperature, at which the electrostatic chuck is to be used. In the plasma etching apparatus shown in FIG. 1, the temperature of the electrostatic chuck during etching is −50° C. to 120° C., and each of the above examples exhibits an electric resistivity within the above range with respect to the temperature range.

For example, in the case where the electrostatic chuck is used in a temperature range of 300° C. to 600° C. as in the thermal CVD, it is required that a material exhibiting an electric resistivity of $1\times10^{10}$ $\Omega\cdot$cm to $1\times10^{12}$ $\Omega\cdot$cm in this temperature range, be selected. For example, pyrolytic boron nitride and Si$_3$N$_4$ are commercially available products which exhibits an electric resistivity falling within the above range when they are heated to this high temperature range. Again, Al$_2$O$_3$ is another example, which is prepared to exhibit an electric resistivity falling in the above range as for the high temperature range, by adjusting the contents of the conductive impurities.

The surface of the resistive layer 3 is finished so as to have a non-mirror state. More specifically, the surface of the resistive layer 3 is formed to have such surface roughness that the center line average height Ra falls within a range of 0.1 to 1.5.

It should be noted that the center line average height Ra is a value expressed in μm obtained by the following equation, where portions having a length L measured from a roughness curve in the direction towards its center line, are extracted; the center line of the extracted portions is taken as an X axis; the direction of the longitudinal magnification is taken as a Y axis; and the roughness curve is expressed in y=f(x).

$$Ra = 1/L \int_0^L |f(x)|dx$$

The center line of the roughness curve is a straight line which is drawn in parallel with the average line of the roughness curve and divides the area defined between the straight line and the roughness curve itself, into two regions having the same area one on either side of the straight line. The average line of the roughness curve is a straight line or a curve which has a geometrical shape of a measured surface in the extracted portions of the roughness curve, and is set such that the sum of squares of the deviation from the line to the roughness curve has the minimum value.

Figures 7, 8:
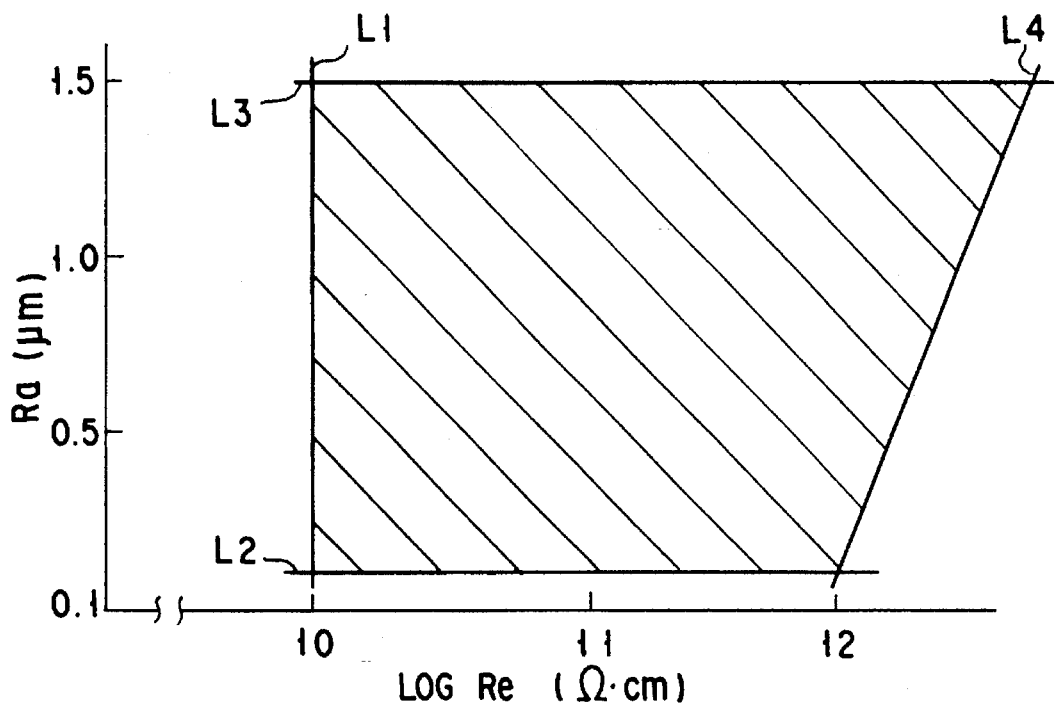
FIG. 7 is a diagram showing the usable range of center line average heights and electric resistivities.
FIG. 8 is a timing chart for the operations of the switches of the apparatus shown in FIG. 5.

As shown in FIG. 7, an examination was conducted by varying the center line average hight Ra (μm) and the electric resistivity Re ($\Omega\cdot$cm) of the resist layer 3 so as to find the range of conditions within which the etching apparatus shown in FIG. 1 can be used. As a wafer W, a Si wafer was used. The target value of an attractive force was set at 10 kg/cm$^2$ or more during chucking, and the target value of a leak current from the resistive layer 3 was set at 1 μA/cm$^2$ or less.

In FIG. 7, log Re is indicated by the X axis, and Ra by the Y axis. The lines L1, L2, L3, and L4 are expressed by the functions of x=10, y=0.1, y=1.5 and y=2x−23.7, respectively. The region defined by the four lines L1 to L4 satisfies the conditions which can be used by the present invention. In the left side of L1, i.e., x<10, the leak current is in excess, whereas in the lower side of L2, i.e., y<0.1, a sufficient potential difference between the resistive layer 3 and the wafer W cannot be obtained. Above L3, i.e. y>1.5, the distance between resistive layer 3 and the wafer W is too large, whereas in the right side of L4, the residual attractive force is too large.

As shown in FIG. 2, due to the roughness of the surface of the resistive layer 3, there exists an interstice BI between the wafer W and the resistive layer 3. When the potential of the positive terminal of the DC power supply 36 is applied to the chuck electrode 32, and the wafer w is grounded via the plasma, a large potential difference is created between a potential $V_3$ of the lower surface of the wafer W and a potential $V_2$ to the upper surface of the resistive layer 3 due to a small voltage drop of the resistive layer 3. As a result, due to the potential difference, i.e. the contact potential difference, a large electrostatic attractive force is generated, and the wafer W is attracted to the resistive layer 3. It should be noted that $v_1$ and $v_4$ represent the potentials of the lower surface of the resistive layer 3 and the upper surface of the wafer W, respectively.

As described, in the present invention, a wafer W is attracted to the resistive layer by utilizing an electrostatic attractive force created by the contact potential difference between the resistive layer 3 and the wafer W. With this structure, a strong attractive force can be obtained by a DC power supply of a low voltage. Further, the problem of the residual attractive force generated in the conventional electrostatic chuck can be solved. The following is a description of the reason for such a solution.

Figure 3:
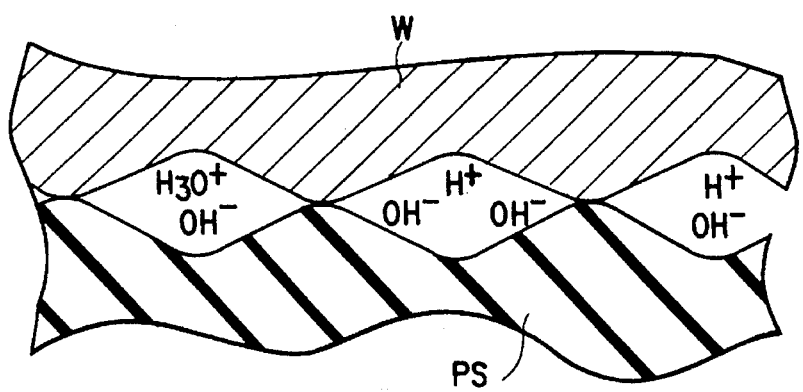
FIG. 3 is an enlarged cross sectional view showing an interface between the dielectric layer of an electrostatic chuck of the conventional technique, and a wafer.

In the conventional electrostatic chuck such as disclosed in U.S. Pat. No. 4,771,730, polarization occurs in the dielectric layer or sheet on the wafer side, generating a positive charge on the dielectric layer on the side in contact with the wafer. In contrast, the wafer is negatively charged, creating an electrostatic attractive force between the wafer and the dielectric layer, whereby the wafer is attracted to the layer. As regards such a conventional electrostatic chuck, the residual potential of the surface of the dielectric layer after unloading a semiconductor wafer was measured. The positive terminal of a direct current power supply of 1.5 kV was connected to the electrode of the electrostatic chuck. According to the results of the measurement, the potential on the surface of the dielectric layer was −700 V. As mentioned above, since a positive charge is created on the surface of the dielectric layer, it was expected that the residual potential on the surface of the dielectric layer was to be a positive potential. However, the actual results of the measurement indicated that the residual potential was negative. From this fact, the following explanation can be provided as to the residual attractive force of the conventional electrostatic chuck. As shown in FIG. 3, there exists an interstice in the interface between the wafer w and the dielectric layer, for example, polyimide sheet PS, of the electrostatic chuck. Into the interstice, a heat conductive gas, He, is supplied. The He gas contains a little amount of moisture, and the moisture is influenced by high voltages from a DC power supply for the electrostatic chuck and a high-frequency power supply for generating plasma, and ionized into hydrogen ion ($H^+$), hydronium ion ($H_3O^+$), and hydroxyl ion ($OH^-$). $H^+$ and $H_3O^+$ are attracted to the wafer W which is negatively charged, whereas $OH^-$ is attracted to the dielectric sheet PS which is positively charged. The charge of $OH^-$ cannot move through the dielectric sheet PS since the sheet PS is highly insulative, and therefore remains on the surface of the sheet PS even after the electrostatic chuck and the DC power supply are disconnected. Consequently, the residual potential on the surface of the sheet PS becomes negative because of this $OH^-$, and the attracting force is generated between $OH^-$ and $H^+$ or $H_3O^+$, thereby creating a residual attractive force.

Similarly, in the present invention, there exists an interstice in the interface between the wafer W and the resistive layer 3, and it is considered that in the interstice, moisture is ionized into $H^+$, $H_3O^+$, which are attracted to the wafer W, and $OH^-$, which is attracted to the resistive layer 3. However, since the resistive layer 3 is conductive while being highly resistive, the charge of $OH^-$ attracted to the surface of the resistive layer 3 goes to the power supply 36 while the power supply 36 is in connection, whereas to the ground via the switch 35 and the terminal 38 after the power supply 36 is switched off by the switch 35. With this structure, $OH^-$ does not remain on the surface of the resistive layer 3, and therefore a residual attractive force is not generated unlike in the case of the conventional electrostatic chuck.

In the conventional electrostatic chuck, an insulation breakdown is likely to occur to the dielectric sheet if the sheet is too thin, and it is difficult to manufacture a thin sheet. Therefore, the thickness of the dielectric sheet must be increased to a certain degree. Further, conventionally, a high voltage power supply must be used in order to polarize a thick dielectric sheet, and to obtain a sufficient attractive force. In the present invention, the resistive layer 3 attracts the wafer W by means of the contact potential difference at the interface between the resistive layer 3 and the wafer W, and therefore the application of a low voltage can create a sufficient attractive force. Consequently, the undesirable influence on the periphery device caused by the application of a high voltage can be removed, and the power supply device can have a simple structure. In the case where the absolute value of the negative potential charged on the wafer W by generation of plasma is large, a contact potential difference sufficient to chuck the wafer W can be obtained simply by grounding the chuck electrode 32 during the generation of the plasma. In this case, the DC power supply 36 can be omitted.

FIG. 4 shows the electrostatic chuck of a plasma etching apparatus according to the second embodiment of the present invention. The apparatus of the second embodiment is identical to that shown in FIG. 1 except for what is so indicated in FIG. 4. In FIG. 4, the structural elements corresponding to those of the apparatus shown in FIG. 1 are designated by the same reference symbols used in FIG. 1, and the description of each of such elements will be omitted.

In this embodiment, an insulative coating 5 is provided on the surface of a resistive layer 3. In the case where the insulative coating 5 is formed so on the resistive layer 3, the contact resistance between the surface of the coating 5 and the wafer W is high, and therefore the resistance as a whole is high. However, since the contact potential difference is not reduced, a sufficient attractive force can be obtained. If the insulation coating 5 is made too thick, $OH^-$ created by ionization of moisture remains on the surface of the coating 5, and may generate a remaining attractive force. Therefore, it is preferable that the thickness of the coating 5 should be, for example, 1 μm.

With the structure shown in FIG. 4, the following advantage can be obtained. When the temperature of the wafer W during the etching process becomes high, and the resistivity of the resistive layer becomes low, the leak current flowing in the longitudinal direction of the resistive layer becomes large. The leak current, which has a bad influence on the wafer W, can be suppressed by providing the coating 5 between the resistive layer and the wafer W.

Figure 5:
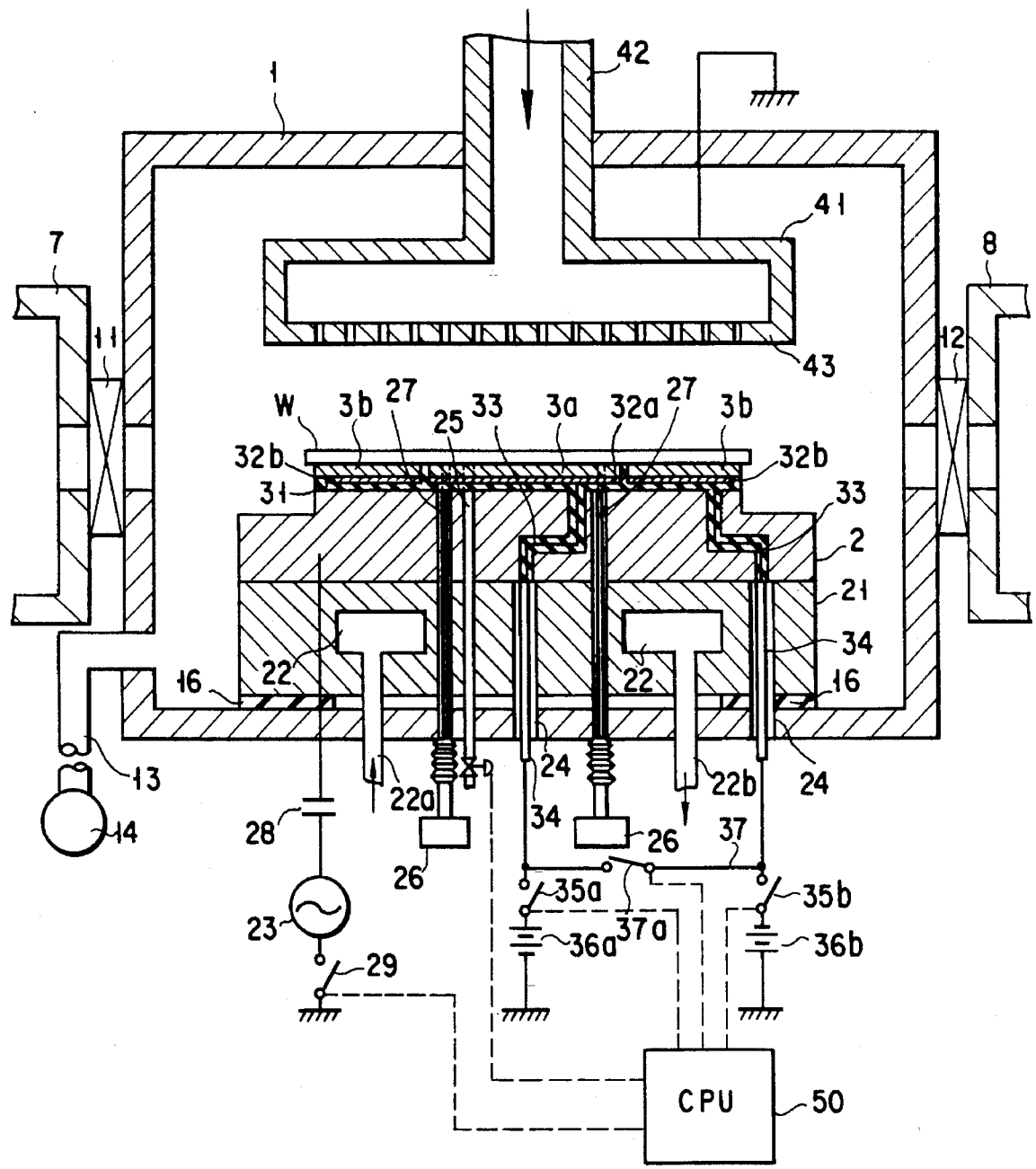
FIG. 5 is a cross sectional view showing a plasma etching apparatus according to a third embodiment of the present invention.
Figure 6:
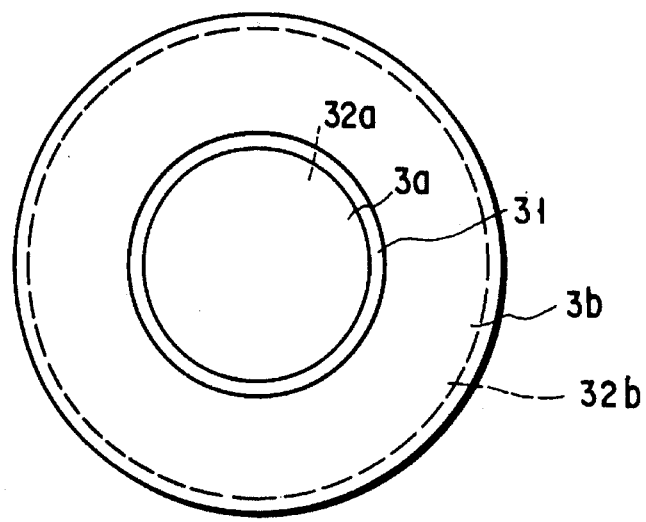
FIG. 6 is a plan view of the electrostatic chuck of the apparatus shown in FIG. 5.

FIG. 5 shows a plasma etching apparatus according to the third embodiment of the present invention. In FIG. 5, the structural elements corresponding to those of the apparatus shown in FIG. 1 are designated by the same reference symbols used in FIG. 1, and the description of each of such elements will be omitted.

In this embodiment, the resistive layer consists of the disk-like first resistive layers 3a and the ring-like second resistive layer 3b coaxially arranged. The chuck electrode also consists of the disk-like first electrode 32a and the ring-like second electrode 32b coaxially arranged as in the case of the first and second resistive layers 3a and 3b. The pair of the first electrode and the resistive layer 32a and 3a, and the pair of the second electrode and the resistive layer 32b and 3b are insulated from each other by means of an insulation layer 31 made of an insulator such as polyimide. The first electrode 32a arranged in the inner side is connected to the positive terminal of the first DC power supply 36a via a switch 35a, whereas the second electrode 32b arranged in the outer side is connected to the negative terminal of the second DC power supply 36b via a switch 35b.

The first and second electrodes 32a and 32b are connected to each other by a line 37, on which a switch 37a is provided. FIG. 8 is a timing chart of the switching operation of each of the switches 35a, 35b, and 36a. The operation of each of the switches 35a, 35b, and 35c is carried out in accordance with an instruction output from the control unit 50 on the basis of a certain program stored in the control unit in advance.

In the electrostatic chuck of the apparatus shown in FIG. 5, the switches 35a and 35b are turned on before the wafer w is placed on the susceptor 2. When the wafer W is placed in this state, a closed loop starting from the power supply 36a through the wafer W to the power supply 36b, and having large contact potential differences between the first resistive layer 3a and the wafer, and between the second resistive layer 3band the wafer W. With this structure, electrostatic attractive forces act between the first resistive layer 3a and the wafer w, and between the second resistive layer 3b and the wafer W, and thus the wafer w is fixedly held on the susceptor 2.

As described, the wafer W can be fixedly held by the electrostatic chuck before the generation of plasma. Therefore, the heat conductive gas can be supplied to the rear surface of the wafer so as to set the wafer at a certain temperature, before the generation of plasma. Consequently, the reliability of the process and the throughput can be enhanced.

Immediately after the generation of plasma, the switch 35a is maintained on, the switch 35b is turned off, and the switch 37a is turned on. With this operation, the same potential from the positive terminal of the first power supply 36a is applied to the first and second electrodes 32a and 32b. Although the abovementioned closed loop is dissolved, an electric conductive line is formed between the susceptor 2 and the upper electrode 41 via plasma, and therefore the wafer W is maintained at a negative potential via the plasma, and fixedly attracted to the electrostatic chuck. Further, since the first and second electrodes 32a and 32b are set at the same potential, the potential gradient within the wafer W during the etching process can be avoided. Thus, the whole wafer can be set at the same potential. This operation is very important in order for performing uniform etching on the whole wafer W.

After performing an etching process for a certain period of time, the switch 35a is maintained on, the switch 35b is turned on, and the switch 37a is turned off. Immediately after that, the supply of the process gas and the heat conductive gas is stopped, and the high-frequency power supply is turned off, so as to finish the generation of plasma. With this operation, the wafer W is again fixed to the electrostatic chuck by means of the closed loop from the power supply 36a through the wafer W to the power supply 36b. Then, the inside of the process chamber 1 is replaced by the inert gas, and during the replacement, the wafer W is fixed by the closed loop.

Next, before the wafer W is removed from the susceptor 2, the switches 35a and 35b are turned off so as to release the wafer W from the electrostatic chuck. As described before, the charge of OH⁻ which should be attracted to the surface of the first resistive layer 3a, and that of $H^+$ or $H_3O^+$ which should be attracted to the surface of the second resistive layer 3b flow into the first and second power supplies 36a and 36b, and therefore a residual attractive force is not created. If necessary, as in the case of the apparatus shown in FIG. 1, the switches 35a and 35b may be made of relay switches which can be switched to the terminal 38 of the ground line.

Figures 9, 10:
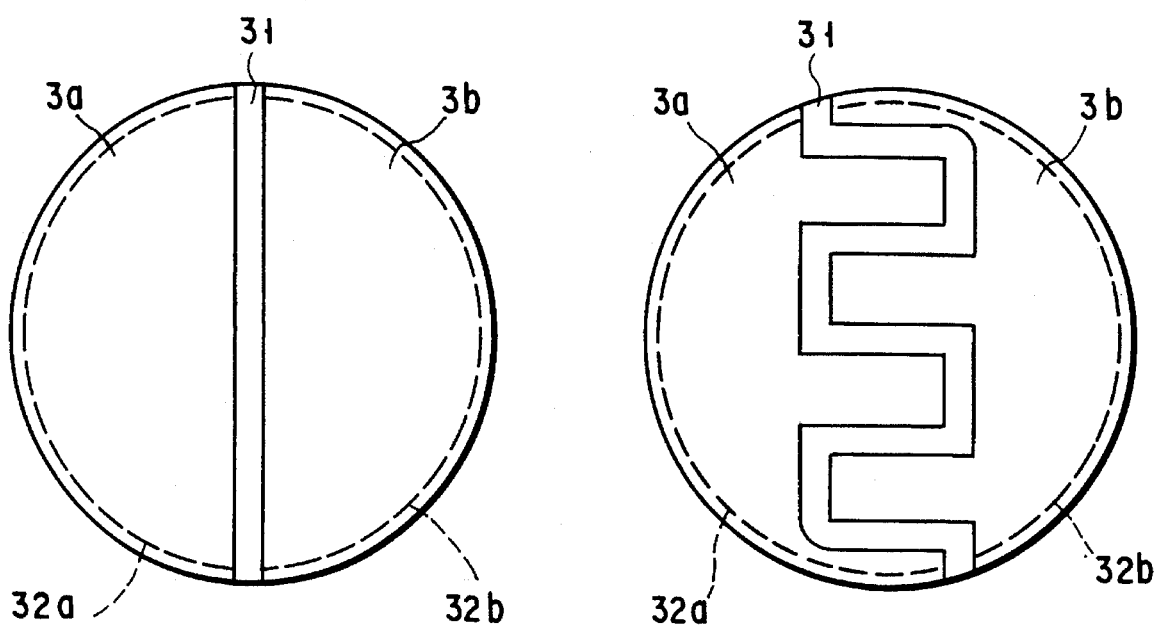
FIG. 9 is a plan view showing a modification of the electrostatic chuck.
FIG. 10 is a plan view showing another modification of the electrostatic chuck.

Each of the first and second resistive layers 3a and 3b, and the first and second electrodes 32a and 32b may be formed into a semi-circular shape as shown in FIG. 9 or into a comb-like shape as shown in FIG. 10. Further, each of the first and second resistive layers 3a and 3b, and the first and second electrodes 32a and 32b may be formed of a number of segments. In some cases, the wafer W has a negative voltage due to the characteristic of plasma, and therefore the first and second electrodes 32a and 32b may be set at the ground potential during generation of plasma depending on the potential of the wafer W.

The electrostatic chucks of the present invention are not limited to be built in the susceptor in a process chamber for the plasma process, and may be set in a loading arm or a stage used in the atmosphere. In this case, however, if there is only one chuck electrode as in the apparatus shown in FIG. 1, a member for applying a potential different from that of the chuck electrode to the wafer should be provided. Further, apart from the plasma etching apparatus, other examples of the plasma processing apparatus applicable for the present invention are a plasma ashing apparatus, and a plasma CVD apparatus. Apart from the semiconductor wafer, another example of a substrate to be processed is a substrate of LCD.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A plasma processing apparatus for processing a substrate having a main surface to be processed, and a rear surface opposite to said main surface, by use of plasma of a process gas, while attracting and holding said substrate on a stage having an electrostatic chuck by an electrostatic attractive force, comprising:

(a) a process chamber for enclosing said substrate;

(b) means for supplying said process gas to said process chamber;

(c) means for evacuating said process chamber and creating a vacuum state;

(d) means for making said process gas into plasma in said process chamber; and (e) said stage provided in said process chamber, said stage comprising:

a main body having a supporting surface for supporting said substrate via said rear surface thereof;

the electrostatic chuck having a first electrode and a second electrode, said first and second electrodes of said electrostatic chuck arranged to face said supporting surface, said first and second electrodes being insulated from each other;

first power supply means for selectively applying a first potential to said first and second electrodes;

second power supply means for selectively applying a second potential different from said first potential to said second electrode;

switch means for selectively connecting said first and second electrodes; and first and second resistive layers for covering said first and second electrodes, respectively, said first and second resistive layers being insulated from each other, each having a surface brought into contact with said rear surface of said substrate when said substrate is supported by said supporting surface, and each exhibiting an electric resistivity of $1 \times 10^{10}$ $\Omega \cdot cm$ to $1 \times 10^{12}$ $\Omega \cdot cm$ in a temperature range when attracting and holding said substrate, wherein while said first and second potentials are applied to said first and second electrodes, respectively, a closed loop from said first power supply means via said substrate to said second power supply means is formed, a contact potential difference is created between said surface of each of said first and second resistive layers and said rear surface of said substrate, and said substrate is attracted and held by said first and second resistive layers, and while said first potential is applied to said first and second electrodes, and a third potential different from said first potential is applied to said substrate via said plasma, a contact potential difference is created between said surface of each of said first and second resistive layers and said rear surface of said substrate, and said substrate is attracted and held by said first and second resistive layers;

the apparatus further including control means for controlling said first and second power supply means such that said first potential is applied to said first and second electrodes when plasma is generated in said process chamber.

2. An apparatus according to claim 1, wherein said surface of each of said first and second resistive layers is formed to have such a surface roughness that a center line average height falls within a range of 0.1 to 1.5 μm.

3. An apparatus according to claim 1, wherein said temperature range is set within −50° C. to 120° C., and each of said first and second resistive layers is formed of a material selected from the group consisting of SiC and $Al_2O_3$ containing conductive impurities adjusted.

4. An apparatus according to claim 1, wherein said supporting surface comprises a surface for supporting a semiconductor wafer.

5. A plasma processing apparatus for processing a substrate having a main surface to be processed, and a rear surface opposite to said main surface, by use of plasma of a process gas, while attracting and holding said substrate on a stage having an electrostatic chuck by an electrostatic attractive force, comprising:

(a) a process chamber for enclosing said substrate;

(b) means for supplying said process gas to said process chamber;

(c) means for evacuating said process chamber and creating a vacuum state;

(d) means for making said process gas into plasma in said process chamber; and (e) said stage provided in said process chamber, said stage comprising:

a main body having a supporting surface for supporting said substrate via said rear surface thereof, first and second electrodes for attracting said substrate, arranged in said main body to face said supporting surface, said first and second electrodes being insulated from each other, first power supply means for selectively applying a first potential to said first and second electrodes, second power supply means for selectively applying a second potential, different from said first potential, to said second electrode, and switch means for selectively connecting said first and second electrodes, wherein said first and second potentials are applied to said first and second electrodes, respectively, from said first and second power supply means so as to attract and hold said substrate on said stage, while no plasma is generated in said process chamber, and said first potential is applied to both of said first and second electrodes from said first power supply means and a third potential different from said first potential is applied to said substrate via said plasma so as to attract and hold said substrate on said stage, while said plasma is generated in said process chamber;

the apparatus further including control means for controlling said first and second power supply means such that said first potential is applied to said first and second electrodes when plasma is generated in said process chamber.

6. The apparatus according to claim 5, further comprising first and second resistive layers for covering said first and second electrodes, respectively, each having a surface facing said rear surface of said substrate when said substrate is supported by said supporting surface.

7. The apparatus according to claim 6, wherein said first and second resistive layers each exhibit an electric resistivity of $1 \times 10^{10}$ $\Omega \cdot cm$ to $1 \times 10^{12}$ $\Omega \cdot cm$ in a temperature range when attracting and holding said substrate, and are electrically insulated from each other.

8. The apparatus according to claim 7, wherein said temperature range is set within −50° C. to 120° C., and said resistive layer is formed of a material selected from the group consisting of SiC, and $Al_2O_3$ containing conductive impurities.

9. The apparatus according to claim 7, wherein said temperature range is set within 300° C. to 600° C., and said resistive layer is formed of a material selected from the group consisting of pyrolytic boron nitride, $Si_3N_4$, and $Al_2O_3$ containing conductive impurities.

10. The apparatus according to claim 5, wherein said supporting surface comprises a surface for supporting a semiconductor wafer.

11. The apparatus according to claim 5, wherein said process gas comprises an etching gas.

12. The apparatus according to claim 6, wherein said surface of each of said first and second resistive layers is formed to have a surface roughness such that a center line average height falls within a range of 0.1 to 1.5 µm, and is brought into direct contact with said rear surface of said substrate.

13. The apparatus according to claim 6, wherein said surface of said resistive layer is coated with a coating of an insulating material, and a thickness of said coating is 1 µm or less.

* * * * *